(12) United States Patent
Xiang et al.

(10) Patent No.: US 6,759,308 B2
(45) Date of Patent: Jul. 6, 2004

(54) SILICON ON INSULATOR FIELD EFFECT TRANSISTOR WITH HETEROJUNCTION GATE

(75) Inventors: Qi Xiang, San Jose, CA (US); Matthew S. Buynoski, Palo Alto, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 58 days.

(21) Appl. No.: 09/902,429

(22) Filed: Jul. 10, 2001

(65) Prior Publication Data
US 2003/0011030 A1 Jan. 16, 2003

(51) Int. Cl.[7] .................................. H01L 21/30
(52) U.S. Cl. ................. 438/455; 438/459; 438/406
(58) Field of Search ...................... 438/455–459, 438/151, 100, 406, 257, 259, 593, 589; 257/77, 136, 192, 264, 72, 69, 204, 274, 338, 368

(56) References Cited

U.S. PATENT DOCUMENTS

| | | | |
|---|---|---|---|
| 5,753,938 A | * | 5/1998 | Thapar et al. ............... 257/77 |
| 5,985,708 A | * | 11/1999 | Nakagawa et al. ......... 438/206 |
| 6,093,623 A | * | 7/2000 | Forbes ....................... 438/455 |
| 6,125,062 A | * | 9/2000 | Ahn et al. ............. 365/189.07 |
| 6,248,626 B1 | * | 6/2001 | Kumar et al. ............... 438/257 |
| 6,274,887 B1 | * | 8/2001 | Yamazaki et al. ............ 257/72 |
| 6,309,950 B1 | * | 10/2001 | Forbes ....................... 438/455 |

OTHER PUBLICATIONS

U.S. patent application Ser. No. 4/484,207, Nishizawa et al., filed Nov. 20, 1984.

* cited by examiner

Primary Examiner—Carl Whitehead, Jr.
Assistant Examiner—Laura M Schillinger
(74) Attorney, Agent, or Firm—Renner, Otto, Boisselle & Sklar LLP (57) ABSTRACT

A field effect transistor (FET) is formed on a silicon on insulator (SOI) substrate in the thin silicon layer above the insulating buried oxide layer. The channel region is lightly doped with a first impurity to increase free carrier conductivity of a first type. The source region and the drain region are heavily dopes with the first impurity. A gate and a back gate are positioned along the side of the channel region and extending from the source region and is implanted with a second semiconductor with an energy gap greater than silicon and is implanted with an impurity to increase free carrier flow of a second type.

20 Claims, 7 Drawing Sheets

SILICON ON INSULATOR FIELD EFFECT TRANSISTOR WITH HETEROJUNCTION GATE

TECHNICAL FIELD

The present invention generally relates to the design of field effect transistors (FETs) and, more particularly to a static induction type FET with a heterojunction gate formed on a silicon on insulator (SOI) wafer.

BACKGROUND OF THE INVENTION

Conventional or bulk semiconductor devices are formed in semiconductive material by implanting a well of either P-type or N-type conductivity silicon in a silicon substrate wafer of the opposite conductivity. Gates and source/drain diffusions are then manufactured using commonly known processes. These form devices known as metal-oxide-semiconductor (MOS) field effect transistors (FETs). When a given chip uses both P-type and N-type, it is known as a complimentary metal oxide semiconductor (CMOS). Each of these transistors must be electrically isolated from the others in order to avoid shorting the circuits. A relatively large amount of surface area is needed for the electrical isolation of the various transistors. This is undesirable for the current industry goals for size reduction. Additionally, junction capacitance between the source/drain and the bulk substrate increase power consumption, require higher threshold voltages, and slows the speed at which a device using such transistors can operate (e.g. degrades frequency response). These problems result in difficulties in reducing the size, power consumption, and voltage of CMOS technology devices.

In order to deal with the junction capacitance problem and improve frequency response, silicon on insulator technology (SOI) has been gaining popularity. A SOI wafer is formed from a bulk silicon wafer by using conventional oxygen implantation techniques to create a buried oxide layer at a predetermined depth below the surface. The implanted oxygen oxidizes the silicon into insulating silicon dioxide in a guassian distribution pattern centered at the predetermined depth to form the buried oxide layer.

An SOI field effect transistor comprises two separated regions consisting of the source and drain regions of the transistor of a first semiconductor conductivity and a channel region between them of the opposite semiconductor conductivity covered by a thin gate insulator and a conductive gate. Conduction in the channel region normally occurs immediately below the gate insulator in the region in which depletion can be controlled by the gate voltage.

A problem associated with reducing the size of an SOI FET structure is a reduction in the length of the channel (distance between the source region and the drain region) degrades FET performance because of a phenomenon known as the short channel effect. More specifically, the decreased channel length permits depletion regions adjacent to the source region and the drain region to extend towards the center of the channel which increases the off state current flow through the channel (current flow when the gate potential is below threshold) and the reduced channel width tends to decrease current flow when the gate potential is above threshold.

Accordingly, there is a strong need in the art for a silicon on insulator field effect transistor structure which can be scaled to sub-micron dimension without significant performance degradation.

SUMMARY OF THE INVENTION

A first object of this invention is to provide a transistor structure. The structure comprises a central channel region comprising a first semiconductor lightly doped with a first impurity element to increase first conductivity free carriers and a source region and a drain region, on opposing sides of the central channel region. Both the source region and the drain region are also of the first semiconductor material heavily doped with the first impurity element. A gate, adjacent the channel region and forming a heterojunction with the channel region, is comprised of the first semiconductor and a second semiconductor, with an energy gap greater than the first semiconductor, and is doped with a second impurity element to increase carriers of the opposite conductivity as the first free carriers.

The transistor structure also includes a backgate which is adjacent to the channel region and on an opposing side of the channel region from the gate. The backgate also forms a heterojunction with the channel region and comprises the first semiconductor and the second semiconductor and is doped with the second impurity element.

The first semiconductor may be silicon and the second semiconductor may be carbon such that the gate and the backgate are a silicon carbide crystal structure. The first impurity may be a donor impurity such as arsenic and the second impurity may be a receptor impurity such as boron such that the first conductivity free carriers may be electrons and the second conductivity free carriers may be holes.

A second aspect of the present invention is to provide a silicon on insulator transistor structure. The structure comprises an insulating oxide layer separating a device layer of semiconductor material from a bulk semiconductor base region. A generally rectangular central channel region within the device layer semiconductor material is doped with a first impurity element to increase first conductivity free carriers. A source region and a drain region are positioned on opposing sides of the generally rectangular central channel region. Both the source region and the drain region comprise the device layer semiconductor material heavily doped with the first impurity element. A gate, adjacent the channel region and forming a heterojunction with the channel region, comprises the device layer semiconductor and a second semiconductor, with an energy gap greater than the device layer semiconductor, and is doped with a second impurity element to increase carriers of the opposite conductivity as the first free carriers.

The silicon on insulator transistor structure also includes a backgate which is adjacent to the channel region and on an opposing side of the channel region from the gate. The backgate also forms a heterojunction with the channel region and comprises the device layer semiconductor material and the second semiconductor and is doped with the second impurity element.

The device layer semiconductor may be silicon and the second semiconductor may be carbon such that the gate and the backgate are a silicon carbide crystal structure. The first impurity may be a donor impurity such as arsenic and the second impurity may be a receptor impurity such as boron such that the first conductivity free carriers may be electrons and the second conductivity free carriers may be holes.

A third aspect of the present invention is to provide a method of controlling the flow of electricity between a source semiconductor region and a drain semiconductor region in a transistor. Both the source semiconductor region and the drain semiconductor region are heavily doped with a first impurity element. The method comprises: a) positioning a generally rectangular central channel region between the source region and the drain region, the channel region lightly doped with the first impurity element to increase free carriers of a first type; b) positioning a gate adjacent the channel region and extending along a side of the central channel region adjacent the source region and forming a junction with the channel region, the gate comprising the semiconductor and a second semiconductor with an energy gap greater than the first semiconductor and being doped with a second impurity element to increase free carriers opposite of the first type; and c) varying the potential of the gate region relative to the source region to control depletion within the channel region.

The method may further include positioning a backgate adjacent the channel region, and on an opposing side of the channel region from the gate, and forming a junction with the channel region, the backgate comprising the first semiconductor and a second semiconductor with an energy gap greater than the first semiconductor and being doped with a second impurity element to increase free carriers opposite of the first type and varying the potential of the backgate relative to the source region to control depletion within the channel region.

The first semiconductor may be silicon and the second semiconductor may be carbon such that the gate and the backgate are a silicon carbide crystal structure. The first impurity may be a donor impurity such as arsenic and the second impurity may be a receptor impurity such as boron such that the first conductivity free carriers may be electrons and the second conductivity free carriers may be holes.

DESCRIPTION OF THE PREFERRED EMBODIMENTS

Figure 1:
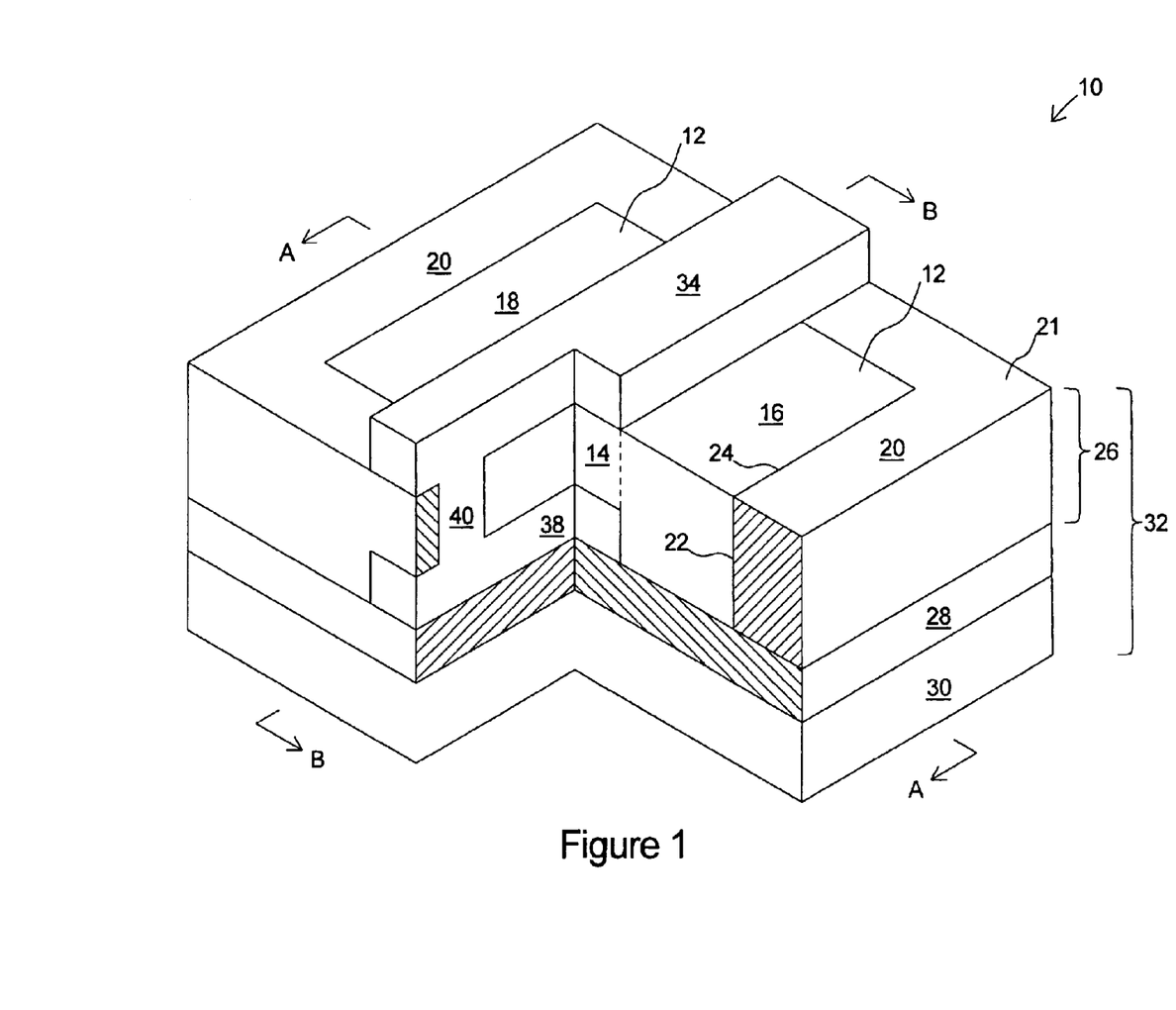
FIG. 1 is a cross-sectional view of a FET fabricated using SOI technology in accordance with one embodiment of this invention.

The present invention will now be described in detail with reference to the drawings. Referring to FIG. 1, a silicon on insulator (SOI) FET 10 is shown in accordance with this invention.

The FET 10 is formed within a thin silicon device layer 26 of an SOI wafer 32. The SOI wafer includes an insulating layer 28 beneath the silicon device layer 26 and a silicon substrate 30 beneath the insulating layer 28 such that the insulating layer isolates silicon structures, such as FET 10, from the silicon substrate 30.

The FET 10 includes an active region 12 which comprises a central channel region 14, a source region 16, and a drain region 18. In the exemplary embodiment of this invention, the channel region 14 is lightly doped N-conductivity silicon and each of the source region 16 and the drain region 18 are each heavily doped N-conductivity silicon.

The active region 12 is isolated by an insulating french 20 which extends from the surface 21 of the silicon device layer 26 down to the insulating layer 28. The insulating french 20 has side walls 22 which define the perimeter 24 of the active region 12 and function to isolate the active region 12 from other structures formed in the silicon device layer 26.

A silicon carbide gate 34 is positioned above the channel region 14 and a silicon carbide backgate 38 is positioned below the channel region 14. In the exemplary embodiment, each of the silicon carbide gate 34 and the silicon carbide backgate 38 comprise silicon carbide implanted with a P-type impurity such as Boron. A conductive via 40 is positioned within the insulating trench 20 and electrically couples the silicon carbide gate 34 to the silicon carbide backgate 38.

In the exemplary embodiment, FET 10 is a normally "off" FET wherein when the potential on the silicon carbide gate 34 and the silicon carbide backgate 38 is at ground, no current will flow from the source region 16 to the drain region 18 because a depletion on the upper portion of the central channel region 14 caused by the silicon carbide gate 34 will extend towards a depletion region on the lower portion of the central channel region 14 caused by the silicon carbide backgate 38. The two depletion regions will "pinch-off" current flow between the source region 16 and the drain region 18.

When a FET activation potential, above a threshold potential, is applied to the silicon carbide gate 34, the via 40 couples the silicon carbide gate 34 to the silicon carbide backgate 38 so that the silicon carbide backgate also achieves FET activation potential. The FET activation potential on the silicon carbide gate 34 causes the depletion region in the upper portion of the channel region 14 to decrease in thickness and FET activation potential on the silicon carbide backgate 38 causes the depletion region in the lower portion of the channel region 14 to decrease in thickness such that current is able to flow from the source region 16 to the drain region 18 via carriers within the center of the channel region 14.

It should be appreciated that carbon, having an energy gap greater than silicon, tends to increase minority carriers (e.g. free electrons) within the P-type silicon carbide gate 34 and silicon carbide backgate 38. As such, junction capacitance at the heterojunctions formed between the channel region 14 and the silicon carbide gate 34 and the silicon carbide backgate 38 is increased. The increased junction capacitance tends to increase the thickness of the depletion regions within the central channel region 14 without increasing the charge that diffuses from the channel region 14 into the silicon carbide gate 34 and the silicon carbide backgate 38.

Figure 2:
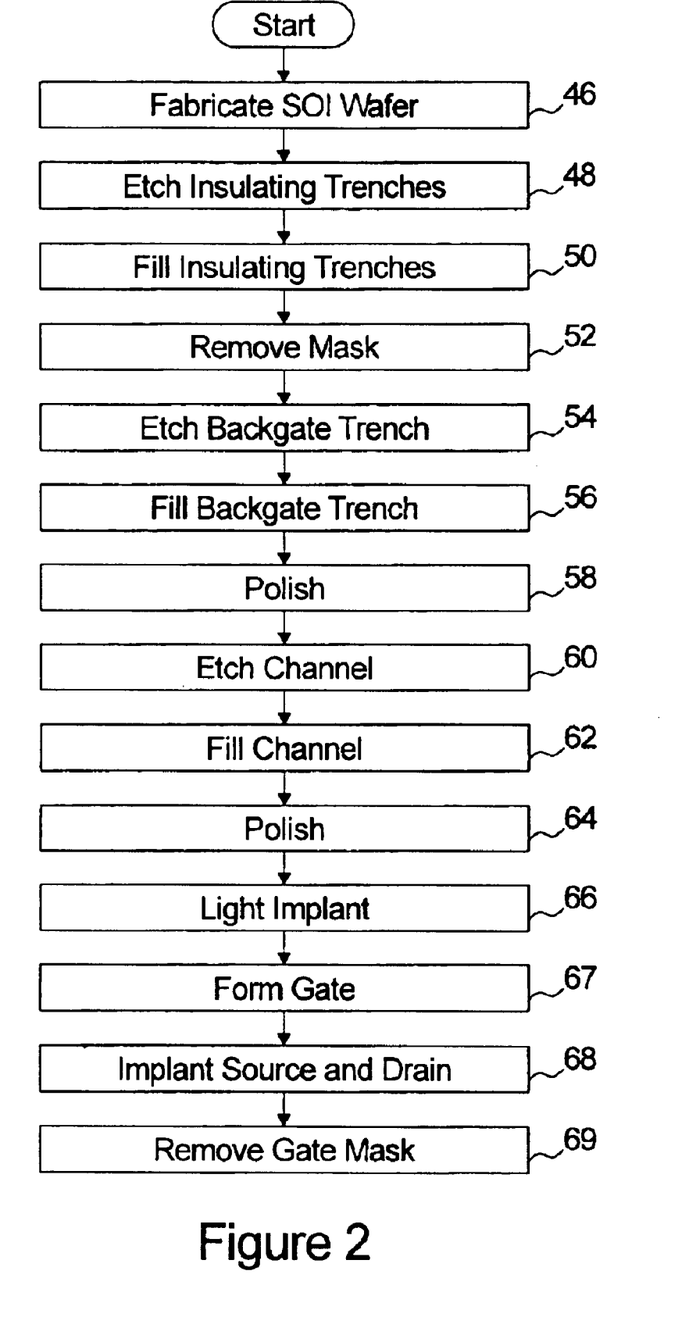
FIG. 2 is a flow chart showing exemplary processing steps for fabrication of the FET of FIG. 1.

Turning to the flowchart of FIG. 2 in conjunction with the cross section diagrams of FIGS. 3a through 3l and FIGS. 4a through 4f, an exemplary process for fabricating the FET 10 of FIG. 1 is shown. Each of FIGS. 3a through 3j represent the cross section A—A of FIG. 1 in various stages of fabrication. Each of FIGS. 4a through 4j represent the cross section B—B of FIG. 1 in various stages of fabrication.

Figure 3A:
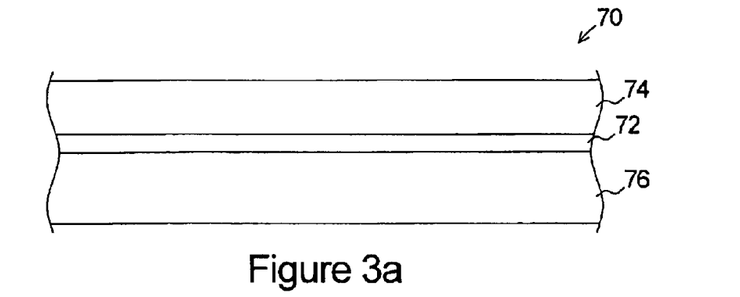
FIG. 3a is a cross section view at cross section AA of a processing step in the fabrication of a FET in accordance with one embodiment of this invention.

Step 46 represents fabricating an SOI wafer 70 with a base silicon substrate 76, a buried oxide layer 72 approximately 500 angstroms in thickness and a device layer 74 approximately 100–500 angstroms in thickness as shown in FIG. 3a. The SOI wafer 70 my be formed from a bulk silicon wafer using Separation by Implantation of Oxygen (SIMOX) techniques to create a buried oxide layer at a predetermined depth below the surface. Utilizing such techniques, the implanted oxygen oxidizes the silicon into insulating silicon dioxide in a guassian distribution pattern centered at the predetermined depth to form the buried oxide layer 72. Alternatively, the SOI wafer 70 may be formed from two bulk silicon wafers utilizing wafer bonding techniques or a well known cutting technique referred to as Smart Cut®. More specifically, an insulating oxide layer of the desired oxide layer thickness is grown on the surface of a first wafer and then a second wafer is bonded to the oxide layer using a heat fusion process. Thereafter, the first wafer is polished to a desired device layer thickness or cut to expose the desired device layer. The principal advantage of cutting the first wafer is that the discarded portion may be used as one of the two wafers for fabricating additional SOI wafers.

Figure 3B:
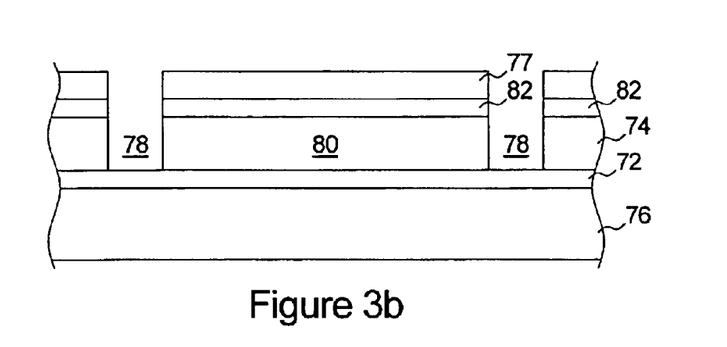
FIG. 3b is a cross section view at cross section AA of a processing step in the fabrication of a FET in accordance with one embodiment of this invention.

Step 48 represents etching an insulating trench 78 into the silicon device layer 74 to form a device island 80 as shown in FIG. 3b. It should be appreciated that the insulating trench 78 appears to be two trenches in FIG. 3b, however, that is only because FIG. 3b is a cross section. The insulating trench 78 is a single trench extending about the periphery of the device island 80. The insulating trench 78 extends completely through the silicon device layer 74 to the buried oxide layer 72. The etching step 48 includes growing a thin oxide layer 82 on the surface of the wafer and forming a silicon nitride mask 77 to define and expose the area corresponding to the insulating trench 78 for etching.

More specifically, the silicon nitride mask 77 is formed by depositing a layer of silicon nitride on the top surface of the oxide layer 82 and patterning and etching the silicon nitride using conventional photolithography techniques wherein 1) a layer of a UV sensitive photoresist compound is applied to the surface of the silicon nitride; 2) UV light is used to image a pattern on the photoresist; and 3) a developer solution hardens the photoresist in the unexposed areas while the UV light dissolves the photoresist such that it is washed away by the developer in the exposed areas (assuming a positive photoresist) leaving the unexposed portions as a photoresist mask on the surface of the silicon nitride layer.

Once masked, a dry etch with an etching compound that etches silicon nitride while not etching the photoresist removes the silicon nitride layer in the areas that are not masked by the photoresist thereby creating the silicon nitride mask 77. Thereafter, an anisotropic etch with a etching compound such as hydrogen bromide (Hbr) is preferably used to etch the insulating trench 78 in the region not masked by the silicon nitride mask 77.

Figure 3C:
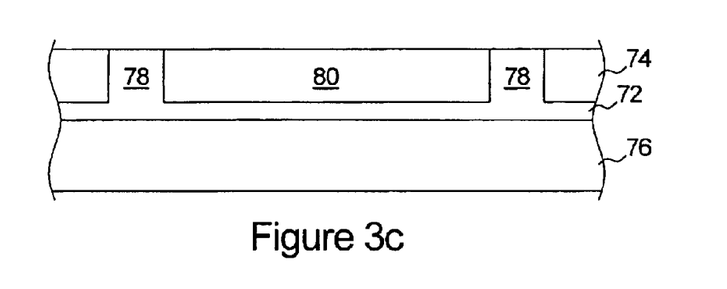
FIG. 3c is a cross section view at cross section AA of a processing step in the fabrication of a FET in accordance with one embodiment of this invention.

Step 50 then represents utilizing conventional filling techniques to back-fill the insulating trench 78 with an insulating material such as silicon dioxide and step 52 represents removing the silicon nitride mask 77 using a wet chemical mechanical polish yield the cross section as shown in FIG. 3c. Back-filling techniques may include filling the insulating trench 78 with a compound such as SiH4 or TEOS and performing a thermal oxidization to oxidize such compound to form silicon dioxide. Other back-filling techniques known to those skilled in the art may also be used.

Figure 3D:
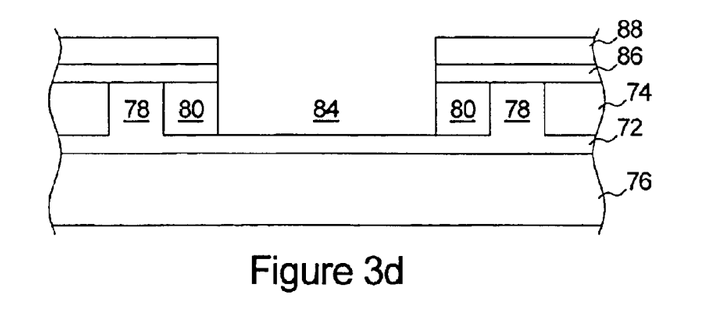
FIG. 3d is a cross section view at cross section AA of a processing step in the fabrication of a FET in accordance with one embodiment of this invention.

Step 54 represents etching a backgate french 84 into the central portion of the island 80 to the depth of the buried oxide layer 72 as shown in FIG. 3d. The etching step 54 again includes growing a thin oxide layer 86 on the surface of the wafer and forming a silicon nitride mask 88 to define and expose the area corresponding to the backgate trench 84. Once the mask 88 is formed, an anisotropic etch with a etching compound such as hydrogen bromide (Hbr) is preferably used to etch the backgate trench 84 in the region of the island 80 not masked by the silicon nitride mask 88.

Figure 4A:
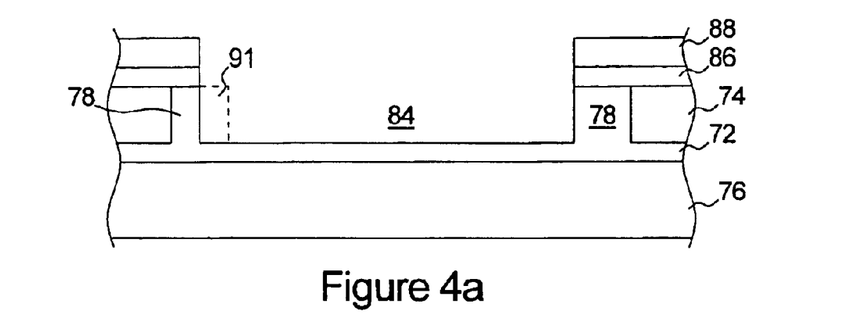
FIG. 4a is a cross section view at cross section BB of the processing step represented by FIG. 3d.

Turning briefly to FIG. 4a, which represents cross section BB of FIG. 1 at the same processing step as represented by FIG. 3d, it can be seen that the backgate trench 84 extends in to the insulating trench 78 in a region 91. This region 91 will become the via 40 of FIG. 1 upon completion of the processing steps.

Figure 3E:
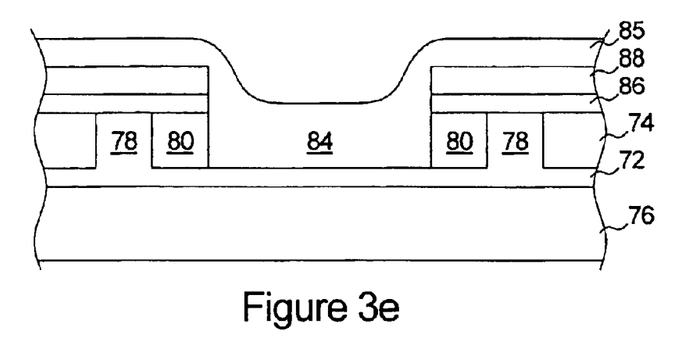
FIG. 3e is a cross section view at cross section AA of a processing step in the fabrication of a FET in accordance with one embodiment of this invention.
Figure 3F:
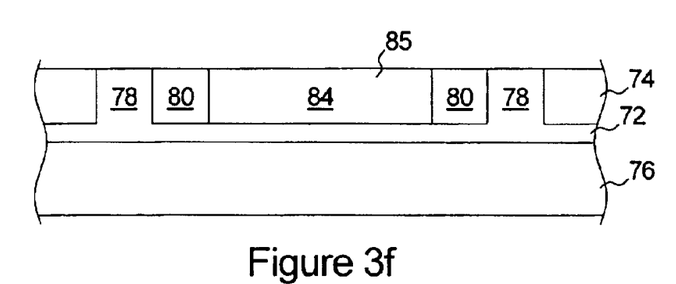
FIG. 3f is a cross section view at cross section AA of a processing step in the fabrication of a FET in accordance with one embodiment of this invention.
Figure 4B:
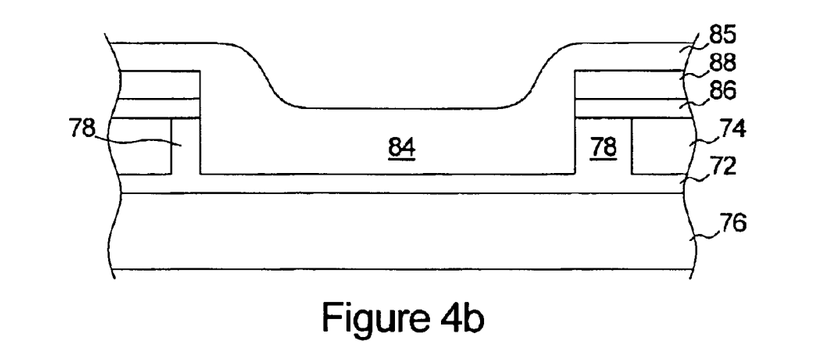
FIG. 4b is a cross section view at cross section BB of the processing step represented by FIG. 3e.
Figure 4C:
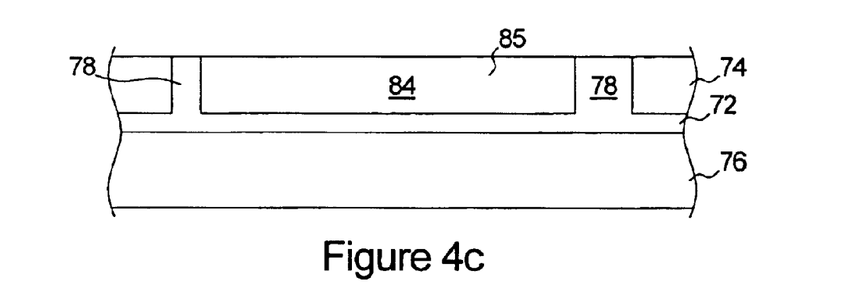
FIG. 4c is a cross section view at cross section BB of the processing step represented by FIG. 3f.

Step 56 represents utilizing conventional filling techniques to fill the backgate trench 84 with silicon carbide 85 as is shown in FIG. 3e and FIG. 4b. Step 58 represents removing the silicon nitride mask 88 using a wet chemical mechanical polish to yield the cross section as shown in FIGS. 3f and 4c. Back-filling techniques may include filling the backgate trench 84 utilizing low pressure chemical vapor deposition (LPCVD) as is known by those skilled in the art with a silicon carbide compound and utilizing an epitaxy process to assure that the silicon carbide forms a crystalline structure and includes implanting the silicon carbide with a receptor impurity such as Boron to increase hole conductivity.

Figure 3G:
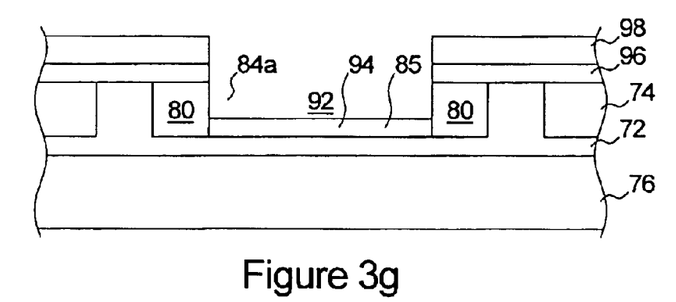
FIG. 3g is a cross section view at cross section M of a processing step in the fabrication of a FET in accordance with one embodiment of this invention.
Figure 3H:
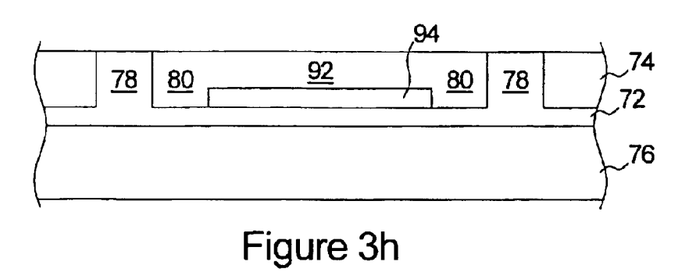
FIG. 3h is a cross section view at cross section AA of a processing step in the fabrication of a FET in accordance with one embodiment of this invention.
Figure 4D:
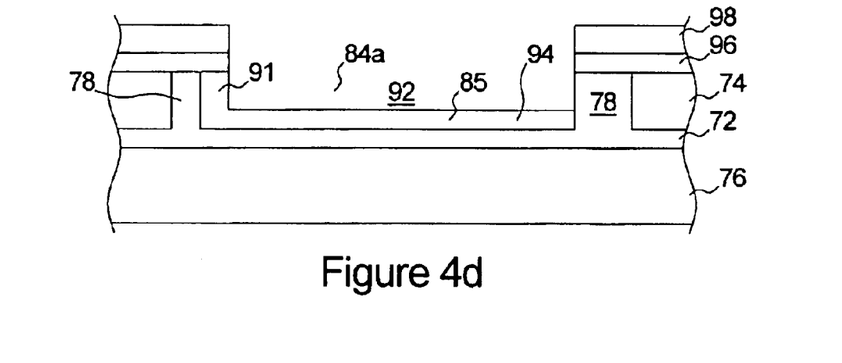
FIG. 4d is a cross section view at cross section BB of the processing step represented by FIG. 3g.

Step 60 represents etching the channel region 92 into the backgate region 84a to the depth effective to leave a backgate 94 above the buried oxide layer 72 as is shown in FIG. 3g and FIG. 4d. It should also be appreciated that the channel region 92 does not extend into the region 91 such that region 91 is the same silicon carbide material as backgate 94.

The etching step 60 again includes growing a thin oxide layer 96 on the surface of the wafer and forming a silicon nitride mask 98 to define and expose the area corresponding to the channel region 92. Once the mask 98 is formed, an anisotropic etch with a etching compound such as hydrogen bromide (Hbr) is preferably used to etch the channel region 92 not masked by the silicon nitride mask 98.

Figure 3I:
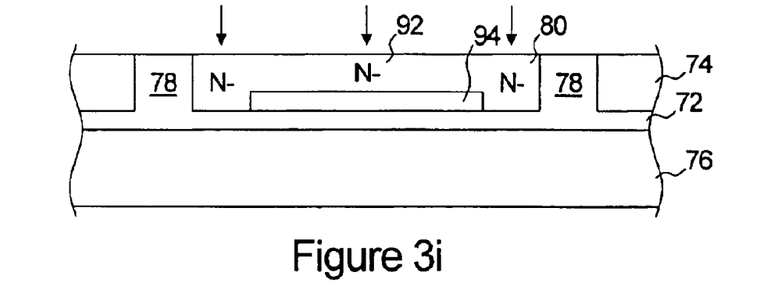
FIG. 3i is a cross section view at cross section AA of a processing step in the fabrication of a FET in accordance with one embodiment of this invention.
Figure 4E:
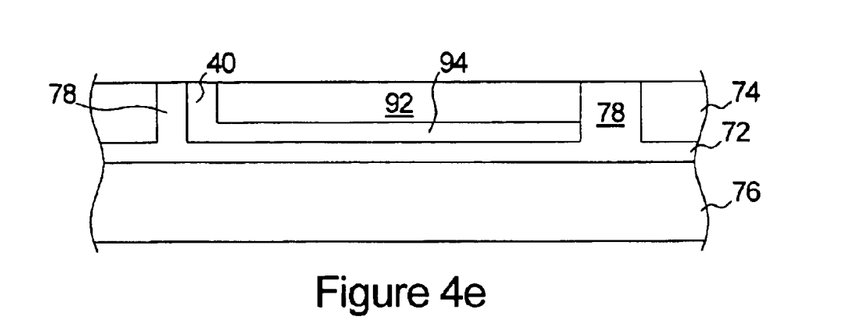
FIG. 4e is a cross section view at cross section BB of the processing step represented by FIG. 3i.
Figure 4F:
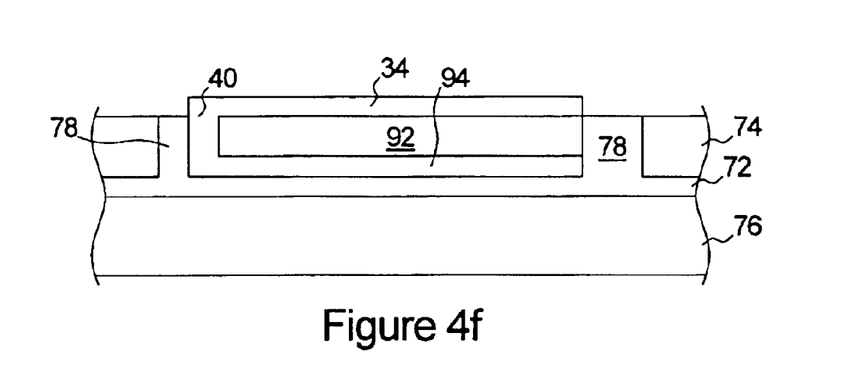
FIG. 4f is a cross section view at cross section BB of the processing step represented by FIG. 3l.

Step 62 represents filling the channel region 92 with silicon and step 64 represents removing the silicon nitride mask 98 using a wet chemical mechanical polish to yield the cross section as shown in FIGS. 3i and 4e. Back-filling techniques may include filling the channel region 92 with a silicon carbide compound and utilizing an epitaxy process to assure that the silicon forms a crystalline structure.

Step 66 represents lightly implanting the channel region 92 with a donor impurity such as Arsenic to increase electron conductivity as is shown in FIG. 3i.

Figure 3J:
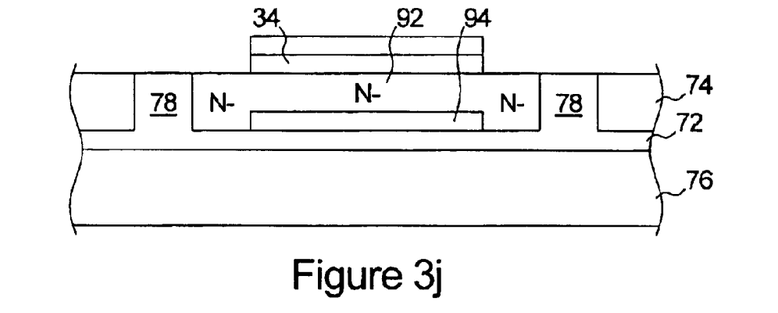
FIG. 3j is a cross section view at cross section AA of a processing step in the fabrication of a FET in accordance with one embodiment of this invention.
Figure 3K:
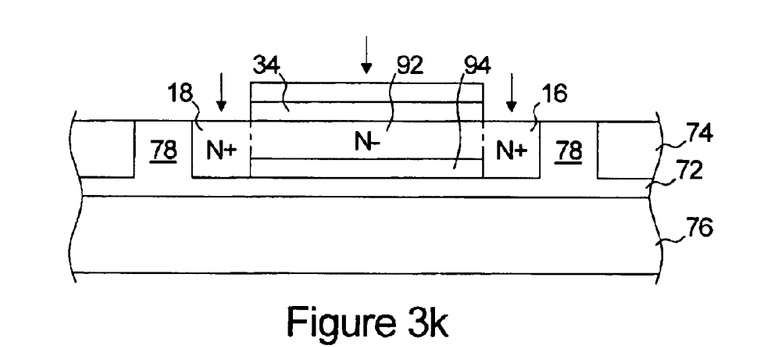
FIG. 3k is a cross section view at cross section AA of a processing step in the fabrication of a FET in accordance with one embodiment of this invention.
Figure 3L:
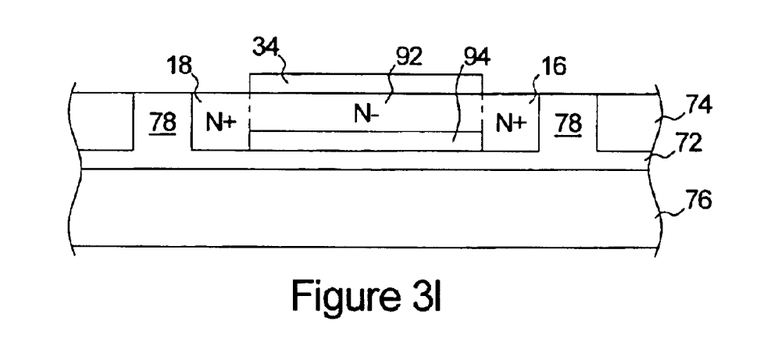
FIG. 3l is a cross section view at cross section AA of a processing step in the fabrication of a FET in accordance with one embodiment of this invention.

Step 67 represents forming the gate 34 on the top of the channel region 92. More specifically, a silicon carbide layer is deposited on the surface of the channel region 92 and is patterned and etched to form the gate 34 as is shown in FIG. 3j. The silicon carbide may be deposited using low pressure chemical vapor deposition (LPCVD) as is known by those skilled in the art and etched utilizing the above described photolithography techniques. At step 68 the source region 16 and drain region 18 on opposing sides of the central channel region 92 may be implanted with an donor impurity such as arsenic as is shown in FIG. 3k. Thereafter, the mask over the gate 34 is removed yielding the FET 10 structure of FIG. 1 as is shown in cross section in FIG. 31 and FIG. 4f.

Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. A transistor structure comprising:
   a) a central channel region consisting of a first semiconductor lightly doped with a first impurity element to increase first conductivity free carriers;
   b) a source region and a drain region on opposing sides of the central channel region, both source region and the drain region consisting of the first semiconductor heavily doped with the first impurity element;
   c) a gate adjacent the channel region and forming a junction with the channel region, the gate comprising the first semiconductor and a second semiconductor with an energy gap greater than the first semiconductor and being doped with a second impurity element to increase carriers of the opposite conductivity as the first free carriers.

2. The transistor structure of claim 1, further including a backgate adjacent the channel region, and on an opposing side of the channel region from the gate, and forming a junction with the channel region, the backgate comprising the first semiconductor and a second semiconductor with an energy gap greater than the first semiconductor and being doped with a second impurity element to increase carriers of the opposite conductivity as the first free carriers.

3. The transistor structure of claim 2, wherein the first semiconductor is silicon.

4. The transistor structure of claim 3, wherein the second semiconductor is carbon and the first and second semiconductor form a silicon carbide crystal structure.

5. The transistor structure of claim 4, wherein the first conductivity free carriers are electrons and the second conductivity free carriers are holes.

6. The transistor structure of claim 5, wherein the first impurity is arsenic.

7. The transistor structure of claim 6, wherein the second impurity is boron.

8. A silicon on insulator transistor structure comprising:
   a) an insulating oxide layer separating a device layer of semiconductor material from a bulk semiconductor base region;
   b) a generally rectangular central channel region within the device layer, the central channel region consisting of a first semiconductor material doped with a first impurity element to increase first conductivity free carriers;
   c) a source region and a drain region on opposing sides of the generally rectangular central channel region, both the source region and the drain region consisting of the first semiconductor material heavily doped with the first impurity element;
   d) a gate adjacent the channel region and extending along a side of the central channel region adjacent the source region and forming a junction with the channel region, the gate comprising the first semiconductor material and a second semiconductor with an energy gap greater than the first semiconductor material and being doped with a second impurity element to increase carriers of the opposite conductivity as the first free carriers.

9. The silicon on insulator transistor structure of claim 8, further including a backgate adjacent the channel region, and on an opposing side of the channel region from the gate, and forming a junction with the channel region, the backgate comprising the first semiconductor material and a second semiconductor with an energy gap greater than the first semiconductor material and being doped with a second impurity element to increase carriers of the opposite conductivity as the first free carriers.

10. The silicon on insulator transistor structure of claim 9, wherein the first semiconductor material is silicon.

11. The silicon on insulator transistor structure of claim 10, wherein the second semiconductor is carbon and the first and second semiconductor form a silicon carbide crystal structure.

12. The silicon on insulator transistor structure of claim 11, wherein the first conductivity free carriers are electrons and the second conductivity free carriers are holes.

13. The silicon on insulator transistor structure of claim 12, wherein the first impurity is arsenic.

14. The silicon on insulator transistor structure of claim 13, wherein the second impurity is boron.

15. The transistor structure of claim 1, wherein the gate extends the entire length of the channel region between the source region and the drain region.

16. The transistor struture of claim 15, further including a backgate adjacent the channel region, extending the entire length of the channel region between the source region and the drain region, on an opposing side of the channel region from the gate, and forming a junction with the channel region, the backgate comprising the first semiconductor and a second semiconductor with an energy gap greater than the first semiconductor and being doped with a second impurity element to increase carriers of the opposite conductivity as the first free carners.

17. The transistor structure of claim 16, further including a conductive via electrically coupling the gate to the backgate.

18. The silicon on insulator structure of claim 8, wherein the gate extends the entire length of the channel region between the source region and the drain region.

19. The silicon on insulator structure of claim 18, further including a backgate adjacent the channel region, extending the entire length of the channel region between the source region and the drain region, on an opposing side of the channel region from the gate, and forming a junction with the channel region, the backgate comprising the first semiconductor material and a second semiconductor with an energy gap greater than the first semiconductor material and being doped with a second impurity element to increase carriers of the opposite conductivity as the first free carriers.

20. The silicon on insulator structure of claim 19, further including a conductive via electrically coupling the gate to the backgate.

* * * * *

UNITED STATES PATENT AND TRADEMARK OFFICE
CERTIFICATE OF CORRECTION

PATENT NO. : 6,759,308 B2
DATED : July 6, 2004
INVENTOR(S) : Xiang et al.

It is certified that error appears in the above-identified patent and that said Letters Patent is hereby corrected as shown below:

Column 3,
Line 56, replace "M" with -- AA --.

Column 4,
Lines 40 and 42, replace "french" with -- trench --.

Column 5,
Line 24, replace "31" with -- 3l --

Column 6,
Line 28, replace "french" with -- trench --.

Column 7,
Line 27, replace "31" with -- 3l --.

Column 8,
Line 61, replace "carners" with -- carriers --.

Signed and Sealed this

Sixteenth Day of November, 2004

JON W. DUDAS
*Director of the United States Patent and Trademark Office*